US010141156B2

(12) United States Patent
Neil et al.

(10) Patent No.: US 10,141,156 B2
(45) Date of Patent: Nov. 27, 2018

(54) MEASUREMENT OF OVERLAY AND EDGE PLACEMENT ERRORS WITH AN ELECTRON BEAM COLUMN ARRAY

(71) Applicant: KLA-Tencor Corporation, Milpitas, CA (US)

(72) Inventors: Mark Allen Neil, San Jose, CA (US); Frank Laske, Weilmunster (DE)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/418,946

(22) Filed: Jan. 30, 2017

(65) Prior Publication Data

US 2018/0090296 A1 Mar. 29, 2018

Related U.S. Application Data

(60) Provisional application No. 62/400,229, filed on Sep. 27, 2016.

(51) Int. Cl.
*H01J 37/20* (2006.01)
*H01J 37/147* (2006.01)
(Continued)

(52) U.S. Cl.
CPC ............ *H01J 37/20* (2013.01); *H01J 37/147* (2013.01); *H01J 37/244* (2013.01); *H01J 37/28* (2013.01);
(Continued)

(58) Field of Classification Search
CPC ........ H01J 37/20; H01J 37/244; H01J 37/147; H01J 37/28; H01J 2237/2817; H01J 2237/2448; H01J 2237/20285
(Continued)

(56) References Cited

U.S. PATENT DOCUMENTS 6,900,447 B2   5/2005  Gerlach
8,278,623 B2  10/2012  Tahmassebpur
(Continued)

FOREIGN PATENT DOCUMENTS

KR    10 2014 00045512 A    4/2014

OTHER PUBLICATIONS

International Search Report dated Jan. 5, 2018, for PCT Application No. PCT/US2017/052816 filed on Sep. 21, 2017 by KLA-Tencor Corporation, 4 pages.

*Primary Examiner* — Michael Maskell
(74) *Attorney, Agent, or Firm* — Spano Law Group; Joseph S. Spano

(57) ABSTRACT

Methods and systems for performing measurements of multiple die with an array of electron beam columns are presented herein. The wafer is scanned in a direction parallel to the die rows disposed on the wafer. The electron beam measurement columns are spatially separated in a column alignment direction. The wafer is scanned in a direction that is oriented at an oblique angle with respect to the column alignment direction such that each electron beam column measures the same row of die features on different die during the same wafer pass. The wafer is oriented with respect to the array of electron beam columns by rotating the wafer, rotating the electron beam columns, or both. In further aspects, each measurement beam is deflected to correct alignment errors between each column and the corresponding die row to be measured and to correct wafer positioning errors reported by the wafer positioning system.

20 Claims, 7 Drawing Sheets

(51) Int. Cl.
*H01J 37/244* (2006.01)
*H01J 37/28* (2006.01)

(52) U.S. Cl.
CPC ............... *H01J 2237/20285* (2013.01); *H01J 2237/2448* (2013.01); *H01J 2237/2817* (2013.01)

(58) Field of Classification Search
USPC ................................. 250/306, 307, 310, 311
See application file for complete search history.

(56) References Cited

U.S. PATENT DOCUMENTS

| | | | |
|---|---|---|---|
| 8,456,639 B2 | 6/2013 | Krishnan et al. | |
| 8,624,971 B2 | 1/2014 | Brown | |
| 8,664,594 B1 | 3/2014 | Jiang et al. | |
| 9,449,788 B2 | 9/2016 | Fan et al. | |
| 2003/0066963 A1* | 4/2003 | Parker | G21K 1/087 250/310 |
| 2005/0146714 A1* | 7/2005 | Kitamura | G06K 9/00 356/237.2 |
| 2005/0279936 A1* | 12/2005 | Litman | G01N 23/225 250/310 |
| 2006/0043291 A1* | 3/2006 | Peng | H01J 37/28 250/310 |
| 2008/0210865 A1* | 9/2008 | Nakagawa | H01J 37/1472 250/307 |
| 2008/0210866 A1* | 9/2008 | Kim | G11B 7/261 250/310 |
| 2008/0302962 A1* | 12/2008 | Takahashi | G01N 23/225 250/310 |
| 2010/0320382 A1* | 12/2010 | Almogy | H01J 37/05 250/307 |
| 2011/0051150 A1* | 3/2011 | Choi | G03F 7/70633 356/620 |
| 2011/0253893 A1* | 10/2011 | Banzhof | H01J 37/1478 250/307 |
| 2013/0206983 A1* | 8/2013 | Yin | H01J 37/20 250/307 |
| 2013/0314710 A1* | 11/2013 | Levy | G01N 21/211 356/402 |
| 2015/0369753 A1 | 12/2015 | Romanovsky | |

* cited by examiner

MEASUREMENT OF OVERLAY AND EDGE PLACEMENT ERRORS WITH AN ELECTRON BEAM COLUMN ARRAY

CROSS REFERENCE TO RELATED APPLICATION

The present application for patent claims priority under 35 U.S.C. § 119 from U.S. provisional patent application Ser. No. 62/400,229, filed Sep. 27, 2016, the subject matter of which is incorporated herein by reference in its entirety.

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of optical metrology based techniques including scatterometry and reflectometry implementations and associated analysis algorithms are commonly used to characterize critical dimensions, film thicknesses, composition, overlay and other parameters of nanoscale structures.

In some examples, optical critical dimension (CD) and film metrologies (spectroscopic or angle-resolved) are employed to monitor structural parameter values during lithographic patterning processes to ensure that structures are fabricated having the desired pitch and profile. However, optical CD and film metrologies suffer from lack of sensitivity to many structures employed in multiple patterning techniques, including buried structures, in particular. For some structural parameters, such as edge placement error (EPE), there is currently no high throughput (e.g., optical) measurement solution.

In another example, optical overlay metrology is also employed, but optical overlay measurements require specialized metrology targets to characterize structures fabricated by multiple patterning techniques. In existing methods, overlay error is typically evaluated based on measurements of specialized target structures formed at various locations on the wafer by a lithography tool. The target structures may take many forms, such as a box in box structure. In this form, a box is created on one layer of the wafer and a second, smaller box is created on another layer. The localized overlay error is measured by comparing the alignment between the centers of the two boxes. Such measurements are taken at locations on the wafer where target structures are available.

Unfortunately, these specialized target structures often do not conform to the design rules of the particular semiconductor manufacturing process being employed to generate the electronic device. This leads to errors in estimation of overlay errors associated with actual device structures that are manufactured in accordance with the applicable design rules. For example, image-based overlay metrology often requires the pattern to be resolved with an optical microscope that requires thick lines with critical dimensions far exceeding design rule critical dimensions. In another example, angle-resolved SCOL often requires large pitch targets to generate sufficient signal at the +1 and −1 propagating diffraction orders from the overlay targets. In some examples, pitch values in the range 500-800 nm may be used. Meanwhile, actual device pitches for logic or memory applications (design rule dimensions) may be much smaller, e.g., in the range 100-400 nm, or even below 100 nm.

In another example, edge placement distance (EPD) and the associated edge placement error (EPE) is an important parameter to monitor and control after device electrical contacts are made. The difference between the desired and the actual EPD is called EPE. EPD and EPE are a function of both overlay and CD errors.

In some examples, critical dimension-scanning electron microscopy (CD-SEM) may be employed to measure overlay and EPE. However, most advanced process nodes require small metrology errors and high throughput that are not achievable with CD-SEM tools.

In summary, semiconductor device yield at device fabrication nodes below 20 nanometers for logic devices and advanced DRAM, and vertical or planar NAND devices is a complex function of many parameters, including film thicknesses, profile parameters of patterned lines, overlay errors, and edge placement errors (EPE). Of these, EPE has the most demanding process window and requires metrology and control of CD and overlay. Currently there is no high-throughput, optical metrology solution for EPE measurements and many on-device overlay measurement applications. In addition, the absence of adequate metrology makes it challenging to define control schemes to improve device yield.

SUMMARY

Methods and systems for performing measurements of multiple die with an array of electron beam columns to estimate parameters of interest are presented herein. Parameters of interest include, but are not limited to, overlay, edge placement errors (EPE), pitch walk, and critical dimensions (CD) of actual device structures located in the device area of a wafer.

In one aspect, multiple electron beam measurement columns measure multiple rows of the same die features on different die in a single wafer pass. The wafer scanning direction is aligned with the die rows disposed on the wafer. Each electron beam measurement column is spatially separated from an adjacent electron beam measurement column by a fixed distance in a column alignment direction. The wafer scanning direction is oriented at an oblique angle with respect to the column alignment direction. The oblique angle is selected such that each electron beam column measures the same row of die features on different die during the same wafer pass.

In a further aspect, each of the plurality of electron beam columns performs a one dimensional measurement of each corresponding row of die features. In other words, the electron beam columns themselves are not operated in a scanning mode.

In some embodiments, the wafer is oriented with respect to the array of columns by rotating the wafer with a rotary stage built into the wafer positioning system.

In some other embodiments, the wafer is oriented with respect to the array of columns by rotating the wafer to the desired orientation with a pre-alignment stage before transferring the wafer from the pre-alignment stage to the wafer positioning system.

In some other embodiments, the wafer is oriented with respect to the array of columns by rotating the array of columns with respect to the wafer.

In a further aspect, each of the measurement beams are deflected by a small amount to correct alignment errors between each column and the corresponding die row to be measured during each wafer pass.

In another further aspect, each of the measurement beams is deflected by a small amount to correct wafer positioning errors reported by the wafer positioning system. In this manner, the location of incidence of the beam of primary electrons onto the wafer is adjusted to compensate for wafer positioning errors.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for performing measurements of multiple die with an array of electron beam columns to estimate parameters of interest are presented herein. Parameters of interest that may be measured include, but are not limited to, overlay, edge placement errors (EPE), pitch walk, and critical dimensions (CD) of actual device structures located in the device area of a wafer.

In one aspect, multiple electron beam measurement columns are employed to perform EPE measurements, overlay measurements, or both, of multiple rows of the same features on different die in a single wafer pass. The wafer scanning direction is aligned with the die rows disposed on the wafer. Each electron beam measurement column is spatially separated from an adjacent electron beam measurement column by a fixed distance in a column alignment direction. The wafer is scanned in a direction that is oriented at an oblique angle with respect to the column alignment direction. The oblique angle is selected such that each electron beam column measures the same row of die features on multiple, different die during the same wafer pass. In a further aspect, each of the plurality of electron beam columns performs a one dimensional measurement of each row of die features. In other words, the electron beam columns themselves are not operated in a scanning mode.

Figure 1:
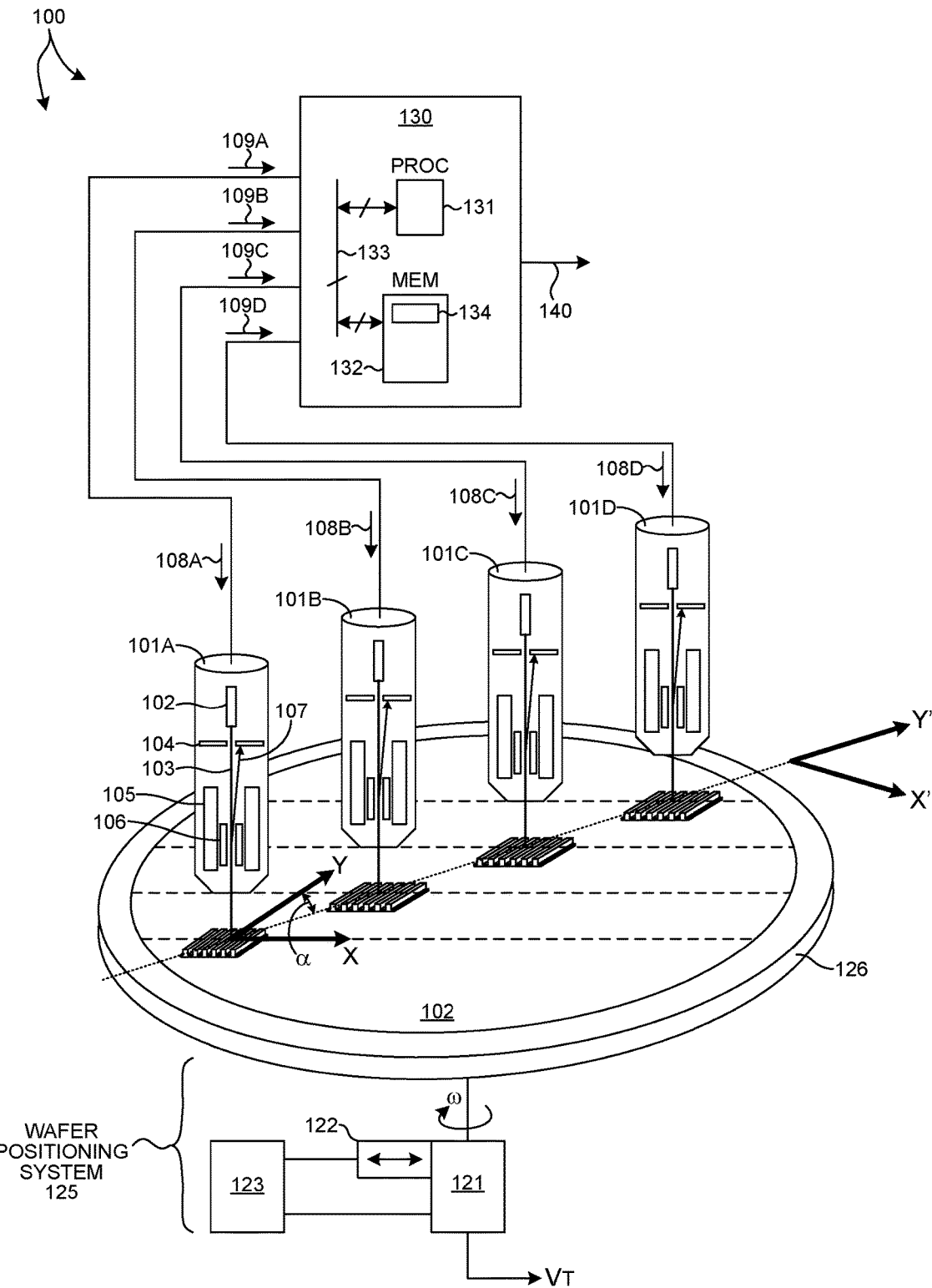
FIG. 1 illustrates a system 100 for performing electron beam inspection measurements of multiple rows of die features with substantially improved throughput in accordance with the exemplary methods presented herein.

FIG. 1 illustrates a system 100 for performing electron beam inspection measurements of multiple rows of die features with substantially improved throughput in accordance with the exemplary methods presented herein. As depicted in FIG. 1, system 100 includes an array of electron beam measurement columns 101A-D, a wafer positioning system 125, and a computing system 130.

The array of electron beam measurement columns 101A-D is configured to perform simultaneous measurements of structures fabricated on wafer 102. Each electron beam column includes an electron beam source 102, a beam deflector 106, an objective lens 105, and a detector 104.

Electron beam source 102 is configured to generate a beam of primary electrons directed to wafer 102. In one embodiment, electron beam source 102 includes a cathode source or emitter that emits electrons. In some embodiments, the electron beam source 102 includes one or more lens elements (e.g., magnetic elements, electromagnetic elements, electrostatic elements, apertures, anodes, etc.). The lens elements accelerate and focus the emitted electrons to generate a primary electron beam 103 directed along the electro-optical axis of the column.

After extraction from the cathode source or emitter, the electrons are at a relatively low energy level defined as the "extraction energy" (EE). After acceleration, the electrons in the primary electron beam 103 are at a higher energy level defined as the "beam energy" (BE). In one example implementation, the EE level may be in a range of 4 to 7 keV, and the BE level may be in a range of 8 to 12 keV. The particular energy levels to be used depend on the particular implementation. In another example implementation, an ultra high BE of up to 35 keV may be used. The BE may be made variable to take advantage of high BE electron-optics to reduce electron-electron interactions without utilizing extremely high voltages.

In some embodiments, the primary electron beam 103 passes through a beam current selection aperture to select the beam current projected onto the wafer. In some embodiments, the beam current selection aperture is a continuously variable aperture. Example embodiments are described in commonly-owned U.S. Pat. No. 8,278,623 issued on Oct. 2, 2012 and U.S. Pat. No. 8,664,594 issued on Mar. 4, 2014, the contents of which are incorporated herein by reference in their entireties.

The primary electron beam 103 is focused onto wafer 102 over a beam spot by objective lens 105. The objective lens 105 is preferably configured to have a very low spherical aberration coefficient and a very low chromatic aberration coefficient. The objective lens 105 may also reduce the energy of the electrons in the primary beam 103 (i.e., decelerate the electrons) from the "beam energy" (BE) level to a lower "landing energy" (LE) level. The particular energy levels to be used depend on the particular implementation. In general, the beam spot is sized smaller than the feature size to be resolved. In some embodiments, feature sizes of 10 nanometers or less are resolved. Thus, the beam spot is sized smaller than 10 nanometers. In some embodiments, feature sizes of 5 nanometers or less are resolved. Thus, the beam spot is sized smaller than 5 nanometers.

Beam deflector 106 is configured to adjust the location of incidence of the beam of primary electrons onto wafer 102. In the embodiment depicted in FIG. 1, beam deflector 106 deflects the beam in the y-direction (i.e., perpendicular to the wafer scanning direction) to adjust the location of incidence of the primary electron beam 103 onto wafer 102. In some embodiments, the beam deflector includes a Wien filter. The Wien filter includes perpendicular electric and magnetic fields that are controlled to deflect the primary electron beam 103 in the y-direction to achieve the desired change of location of the beam spot on wafer 102.

The impingement of the primary electron beam 103 onto wafer 102 causes emission of secondary electrons 107. The secondary electrons are extracted from wafer 102 and deflected away from the electro-optical axis of the electron column by the Wien filter of beam deflector 106. In some embodiments, the electrostatic deflection field of the Wien filter is employed to deflect the primary electron beam, and the perpendicular magnetic deflection field is balanced with the electrostatic deflection field to deflect the secondary electrons 107 from the path of the primary electron beam 103 toward detector 104.

Detector 104 is configured to detect the secondary electrons 107 and generate an output signal 109A based on the detected intensity of the secondary electrons. Electrons are gathered from the sample with regular periodicity and converted to a digital intensity signal. As both the stage position and signal intensity are known for each sample, the secondary electron intensity signals 109A-D are synchronized with the wafer position to generate a one dimensional measurement of measured intensities as a function of wafer position along the scanning direction (i.e., the x-direction depicted in FIG. 1).

Wafer 102 is accurately positioned under the array of columns 101A-D by a wafer positioning system 125. In some embodiments, the wafer positioning system locates the wafer with respect to the array of electron beam measurement columns with a repeatability of less than one nanometer. This enables absolute positioning determination of measured features within a few nanometers.

In the embodiment illustrated in FIG. 1, wafer positioning system 125 moves wafer 102 under electron beam measurement columns 101A-D to adjust the location of the beam spots on the wafer surface. Wafer positioning system 125 includes a wafer chuck 126, motion controller 123, a rotation stage 121 and translation stages 122. Wafer 102 is supported on wafer chuck 126.

Wafer 102 is located with its geometric center approximately aligned with the axis of rotation of rotation stage 121. In this manner, rotation stage 121 rotates wafer 102 to achieve the desired oblique angle, α, between the column alignment direction (i.e., the y' direction depicted in FIG. 1) and the wafer scan direction (i.e., the x-direction depicted in FIG. 1) within an acceptable tolerance. The translation stages 122 translate the wafer 102 in the wafer scanning direction at a specified velocity, VT. Motion controller 123 controls the rotation of wafer 102 by rotation stage 121 and the translation of wafer 102 by translation stages 122 to achieve the desired orientation and scanning motion of wafer 102 within system 100.

Computing system 130 is configured to receive the output signals 109A-D generated by each of the electron beam measurement columns 102A-D and estimate an overlay value, an edge placement error value, or both, based on the output signals. In some examples, the values of the parameter of interest are estimated by comparing the measured intensity signals 109A-D with design reference data.

Figure 2:
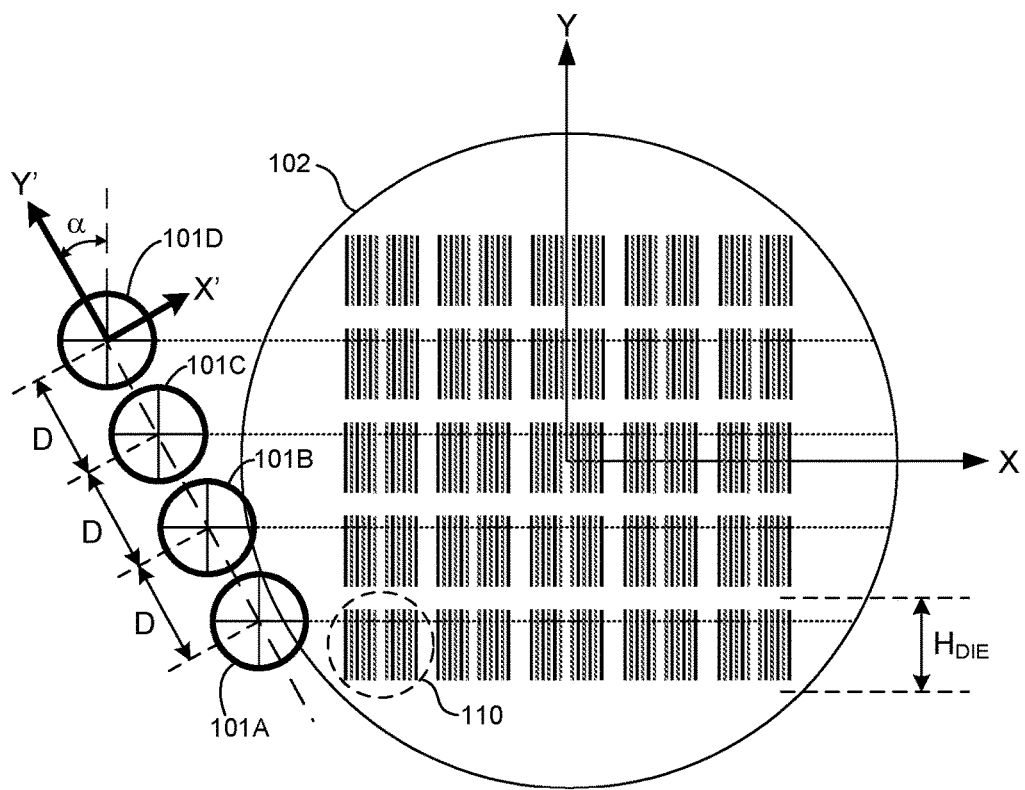
FIG. 2 depicts a top view of wafer 102 and the array of columns 101A-D depicted in FIG. 1.

As described herein, wafer 102 is rotated with respect to the array of electron beam measurement columns 101A-D such that the spacing between rows of similar die features to be inspected matches the electron beam column spacing in the direction perpendicular to the die rows. FIG. 2 depicts a top view of wafer 102 and the array of columns 101A-D. As depicted in FIG. 2, the columns are equally spaced apart from one another by a distance, D, in the column alignment direction (y'-direction). In one example, the electron beam measurement columns are each separated by a distance of 20 millimeters. In addition, FIG. 2 illustrates several die rows extending in the x-direction. Each die row has a die height, $H_{DIE}$, extending in the y-direction. To match the die row spacing with the column spacing in the direction perpendicular to the scan direction, wafer 102 is oriented relative to the array of columns die rows at an oblique angle, α, where, α, is given by equation (1).

$$\alpha = \cos^{-1}\left(\frac{H_{DIE}}{D}\right) \qquad (1)$$

In this manner, each column probes the same features in each different die row.

Figure 3:
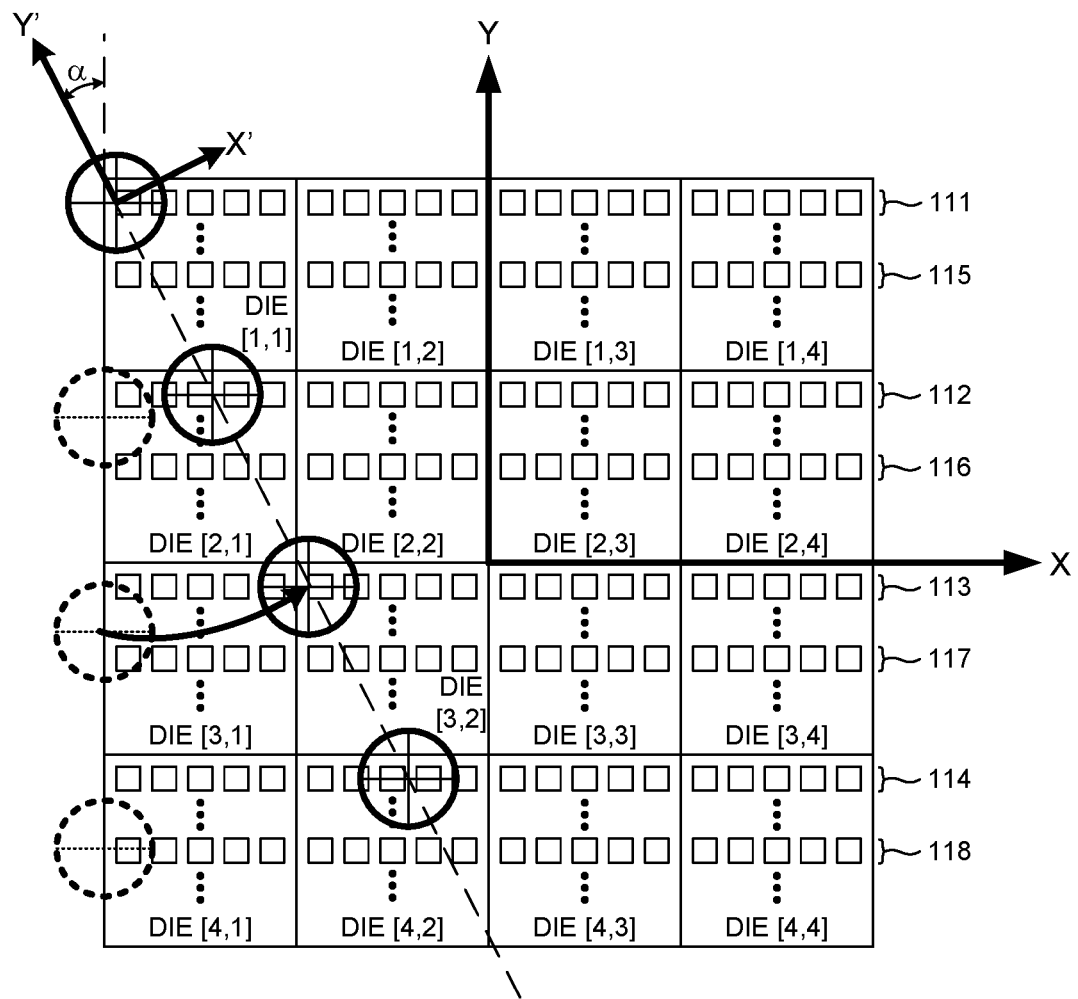
FIG. 3 depicts a top view of the array of columns 101A-D and wafer 102 with rows of die depicted in greater detail.

FIG. 3 depicts a top view of the array of columns 101A-D and wafer 102 with rows of die depicted in greater detail. In the illustration of FIG. 3, sixteen die are arranged on wafer 102 in four rows. As depicted in FIG. 3, each die includes rows of features. Feature rows 111-114 are the same features and are located in the same locations with respect to each respective die. Similarly, feature rows 115-118 are the same features and are located in the same locations relative to each respective die. As depicted in FIG. 3, the column alignment direction (i.e., the y'-direction) is oriented at an oblique angle, α, with respect to the wafer scan direction (i.e., the x-direction). In addition, the wafer scan direction is parallel to the direction of extent of the die rows disposed on wafer 102. The oblique angle is selected such that each column measures the same feature row of each corresponding die row. In other words, each of the feature rows 111-114 are measured in the same wafer pass by a corresponding column. Similarly, each of the feature rows 115-118 are measured together in another wafer pass by each corresponding column.

Figure 4:
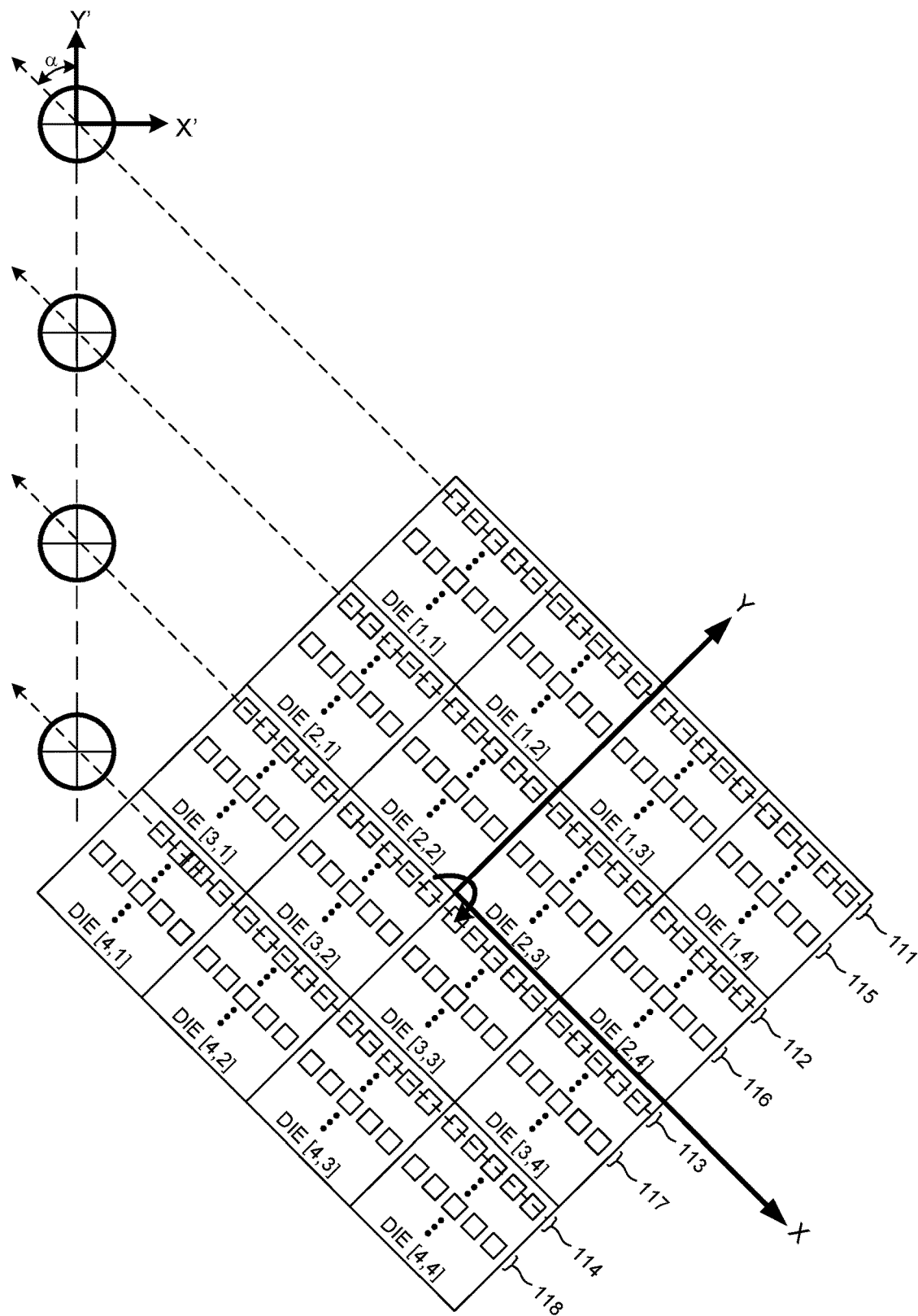
FIG. 4 depicts a top view of wafer 102 rotated with respect to the array of columns 101A-D such that each column measures the same feature row of each corresponding die row.

In some embodiments, wafer 102 is oriented with respect to the array of columns 101A-D by rotating wafer 102 with a rotary stage built into the wafer positioning system (e.g., rotary stage 122 depicted in FIG. 1). FIG. 4 depicts a top view of wafer 102 rotated with respect to the array of columns 101A-D such that each column measures the same feature row of each corresponding die row.

In some other embodiments, the wafer 102 is oriented with respect to the array of columns 101A-D by rotating the wafer to the desired orientation with a pre-alignment stage before transferring the wafer from the pre-alignment stage to the wafer positioning system 125.

In some other embodiments, the wafer 102 is oriented with respect to the array of columns 101A-D by rotating the array of columns 101A-D with respect to wafer 102. FIG. 3 depicts a top view of the array of columns 101A-D rotated with respect to wafer 102 such that each column measures the same feature row of each corresponding die row. In one example, the array of columns 101A-D is mounted to a frame that is moveable within system 100. The moveable frame is repositioned with respect to the wafer positioning system and wafer 102 such that the desired angle with respect to wafer 102 is achieved.

In general, the orientation of wafer 102 with respect to the array of columns 101A-D may be changed by any combination of the movements of the wafer and the array of columns, before or after wafer 102 is transferred onto wafer positioning system 125.

As described herein, the wafer 102 is oriented with respect to the array of columns 101A-D by a relative rotation of wafer 102 with respect to the array of columns 101A-D. However, in many examples, this movement is not sufficiently accurate to ensure that that each column measures the same feature row of each corresponding die row. Tolerances in the alignment of the columns and wafer positioning errors may lead to small misalignments between each column and the corresponding die row to be measured during each wafer pass.

In a further aspect, the measurement beams are deflected by a small amount to correct alignment errors between each column and the corresponding die row to be measured during each wafer pass. As depicted in FIG. 1, the array of columns receives command signals 108A-D. In response, each measurement beam is deflected by a corresponding beam deflector (e.g., beam deflector 106) to adjust the location of incidence of the beam of primary electrons onto wafer 102 to correspond to (e.g., overlap) the row of features to be measured.

In general, wafer positioning system 125 is a feedback positioning system that continuously measures its current position, compares that position with a desired position, and generates motion control commands to drive those errors toward zero. However, the bandwidth of the wafer positioning system is finite, and thus it is unable to track the desired motion trajectory perfectly in an actual operational environment.

In a further aspect, the measurement beams are deflected by a small amount to correct wafer positioning errors reported by the wafer positioning system 125. In some embodiments, the positioning errors are measured by wafer positioning system 125 and signals indicative of these errors (not shown) are communicated to computing system 130. In turn, computing system 130 communicates signals 108A-D to columns 101A-D, respectively, that include commands to compensate for the wafer positioning errors. As depicted in FIG. 1, the array of columns receives command signals 108A-D. In response, each measurement beam is deflected by a corresponding beam deflector (e.g., beam deflector 106) to adjust the location of incidence of the beam of primary electrons onto wafer 102 to compensate for the wafer positioning errors. Thus, in general, the errors in stage positioning are continuously communicated to the column control electronics to deflect the beam and correct for these errors.

Many advanced logic and memory devices fabricated at semiconductor device fabrication nodes below 20 nanometers are constructed using multiple patterning processes. Exemplary multiple patterning processes include self-aligned double patterning (SADP), self-aligned triple patterning (SATP), and self-aligned quadruple patterning (SAQP) techniques.

In one example, a SAQP fin formation process achieves a target pitch that is one-quarter of the pitch obtainable with conventional single pattern lithography. In one example, at least fourteen steps are required to generate the fin structures. These steps include lithography, etch, and strip steps that must be precisely controlled to realize the fin structures with the desired pitch and profile. The final pitch values and fin profile (e.g. CD, SWA) achieved by the SAQP fin formation process are impacted by structural parameter values from previous steps (e.g., resist profile parameters, spacer film thicknesses, and others).

Figure 5:
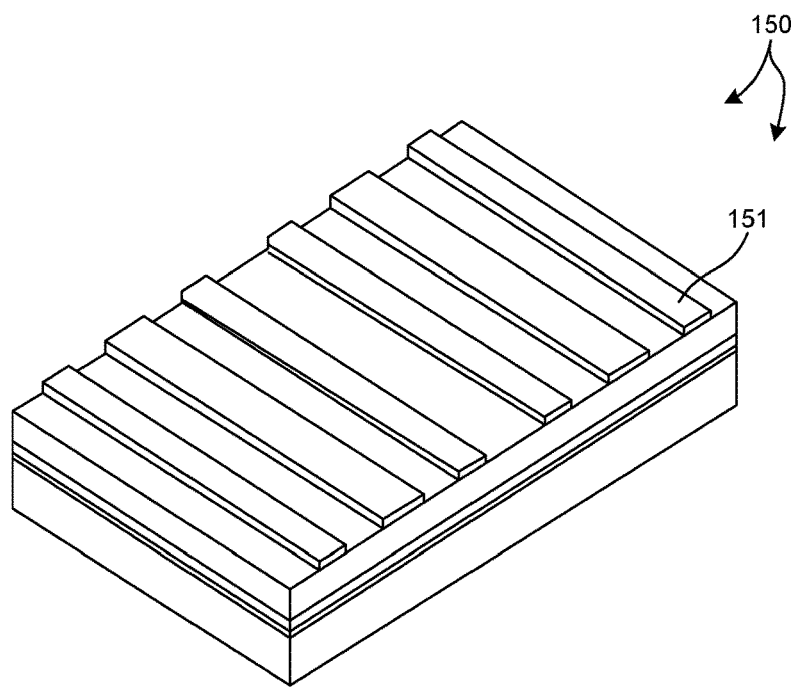
FIG. 5 is a diagram depicting a hardmask pattern of line structures 151 fabricated in a static random access memory (SRAM) area 150 of a microelectronic chip.
Figure 6:
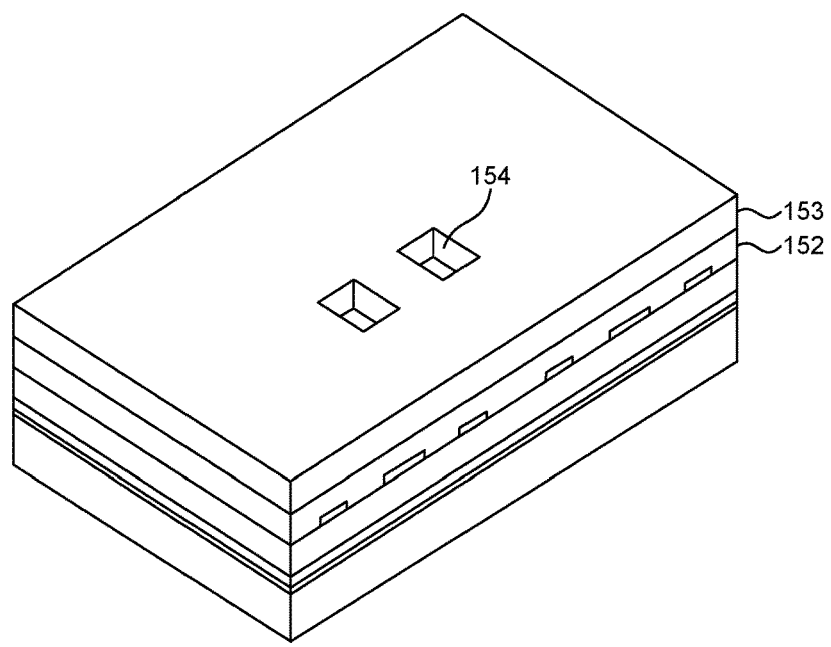
FIG. 6 is a diagram depicting a bottom anti-reflective coating (BARC) layer 152 and a resist layer 153 disposed on top of the pattern of line structures depicted in FIG. 5.

FIG. 5 depicts a hardmask pattern of line structures 151 fabricated in a static random access memory (SRAM) area 150 of a microelectronic chip. The complex layout of the active region is created by combining multiple patterning techniques with cut masks. Cut masks selectively remove portions of the hardmask layer that is used to pattern the substrate into active regions. FIG. 6 depicts a bottom anti-reflective coating (BARC) layer 152 and a resist layer 153 disposed on top of the pattern of line structures depicted in FIG. 5. The resist layer is used to selectively remove part of the hardmask pattern below the openings 154 of the resist layer 153. As depicted in FIG. 5, the hardmask pattern of line structures 151 is buried by the BARC layer 152, even within the openings 154 of the resist layer 153. In some embodiments, reliable measurements of overlay are performed in the manner described herein to provide adequate yield for the cut mask process.

Figure 7:
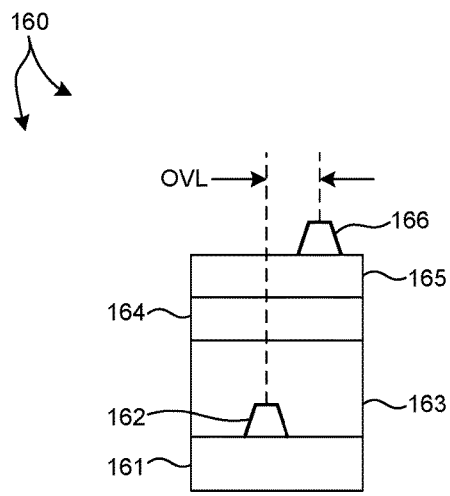
FIG. 7 depicts a cross-section of a structure 160 that may be measured by system 100 depicted in FIG. 1.

FIG. 7 depicts a cross-sectional view of a semiconductor structure 160 measured by an array of electron beam columns as described herein. Structure 160 includes a material layer 161 that includes a buried structure 162. Material layers 163 and 164 separate structure 162 from BARC layer 165. A photoresist structure 166 is disposed on top of BARC layer 165. As depicted, structure 160 includes an overlay offset, OVL, which is measured by an array of electron beam columns as described herein.

Figure 8:
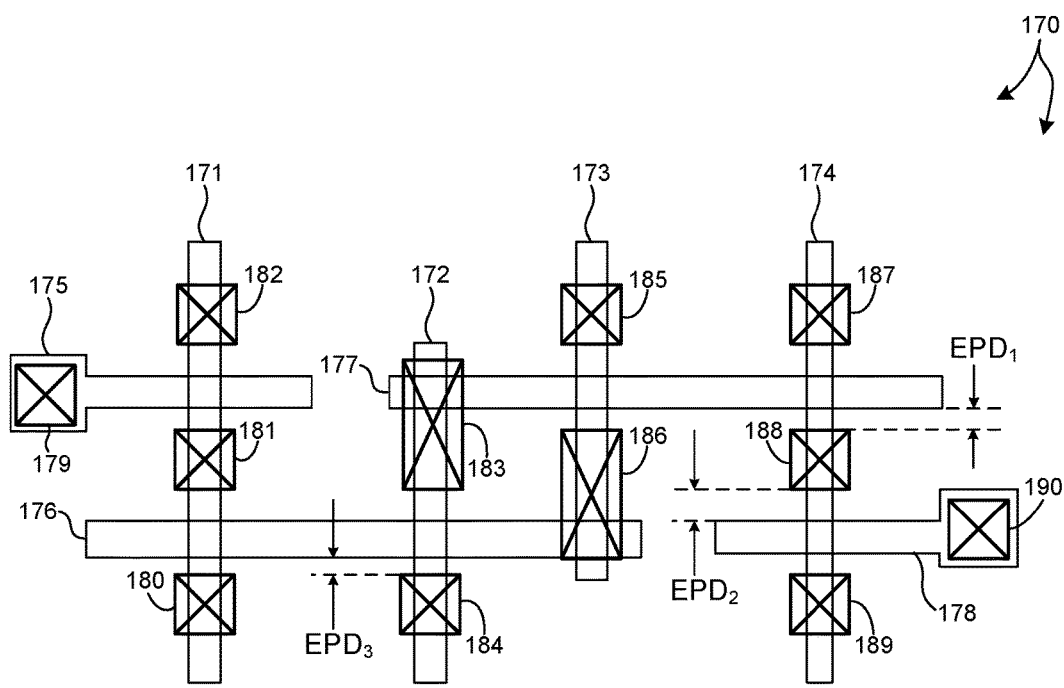
FIG. 8 depicts a top view of a device structure 170 that includes active fields, gates, and contacts.

FIG. 8 depicts a top view of the actual device structure 170 that includes active fields 171-174, gates 175-178, and contacts 179-190. FIG. 8 illustrates the edge placement distance, $EPD_1$, between gate 177 and contact 188. FIG. 8 also illustrates the edge placement distance, $EPD_2$, between gate 178 and contact 188 and the edge placement distance $EPD_3$, between gate 176 and contact 184. The edge placement distances must be carefully controlled to ensure high device yield. If the edge placement error associated with any of these edge placement distances is too large, the device will fail. As illustrated in FIG. 8, both overlay errors and CD errors contribute to EPE. For example, EPE results if the layers associated with the contact are misaligned with the layers associated with the gates. Similarly, EPE results if the CD associated with the contact structures deviates from nominal dimensions. For example, contacts 183 and 186 are too large. The result is overlap between each contact and corresponding gate structure and device failure. In some embodiments, the edge placement errors, $EPE_1$, $EPE_2$, and $EPE_3$ are measured by the array of electron columns 102 as described herein.

Figure 9:
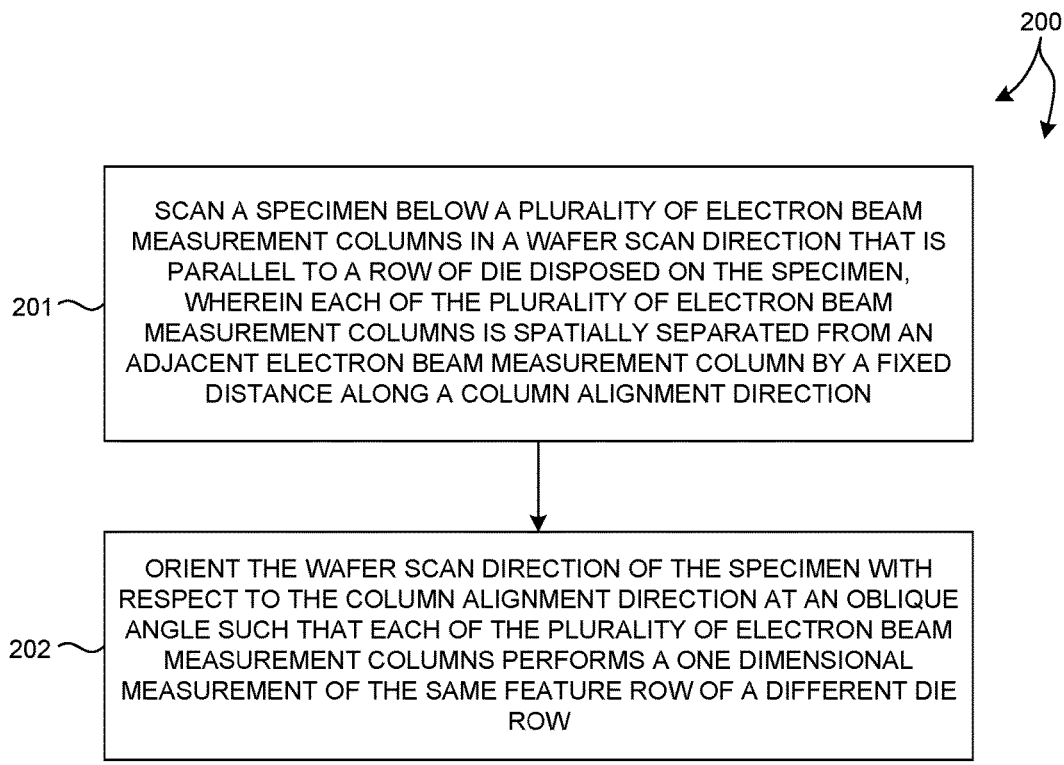
FIG. 9 is a flowchart illustrative of a method 200 of performing probe measurements of multiple die with an array of electron beam columns to estimate parameters of interest in at least one novel aspect.

FIG. 9 illustrates a method 200 of performing measurements of multiple die with an array of electron beam columns to estimate parameters of interest in at least one novel aspect. Method 200 is suitable for implementation by a metrology system such as metrology system 100 illustrated in FIG. 1 of the present invention. In one aspect, it is recognized that data processing blocks of method 200 may be carried out via a pre-programmed algorithm executed by one or more processors of computing system 130, or any other general purpose computing system. It is recognized herein that the particular structural aspects of metrology system 100 do not represent limitations and should be interpreted as illustrative only.

In block 101, a specimen is scanned below a plurality of electron beam measurement columns in a wafer scan direction. The wafer scan direction is parallel to a row of die disposed on the wafer. Each of the plurality of electron beam measurement columns is spatially separated from an adjacent electron beam measurement column by a fixed distance along a column alignment direction.

In block 102, the wafer scan direction of the specimen is oriented with respect to the column alignment direction at an oblique angle. At this oblique angle each of the plurality of electron beam measurement columns performs a one dimensional measurement of the same feature row of a different die row.

It should be recognized that the various steps described throughout the present disclosure may be carried out by a single computer system 130 or, alternatively, a multiple computer system 130. Moreover, different subsystems of the system 100 may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the array of electron beam columns 102A-D in any manner known in the art. For example, the one or more computing systems 130 may be coupled to computing systems associated with each of the array of electron beam columns. In another example, the array of columns 101A-D may be controlled directly by a single computer system coupled to computer system 130.

The computer system 130 of the metrology system 100 may be configured to receive and/or acquire data or information from the subsystems of the system (e.g., wafer positioning system 125, electron beam measurement columns 101A-D, and the like) by a transmission medium that may include wireline and/or wireless portions. In this manner, the transmission medium may serve as a data link between the computer system 130 and other subsystems of the system 100.

Computer system 130 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board metrology system 100, external memory, or other external systems). For example, the computing system 130 may be configured to receive measurement data from a storage medium (i.e., memory 132 or an external memory) via a data link. For instance, measurement data obtained using electron beam measurement columns 101A-D may be stored in a permanent or semi-permanent memory device (e.g., memory 132 or an external memory). In this regard, the measurement results may be imported from on-board memory or from an external memory system. In another example, the computing system 130 may be configured to receive reference measurement data from a reference measurement source (e.g., a storage medium) via a data link. For instance, reference measurement data may be stored in a permanent or semi-permanent memory device. In this regard, the reference measurement results may be imported from on-board memory or from an external memory system. Moreover, the computer system 130 may send data to other systems via a transmission medium. For instance, a estimated device parameter value 140 determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In yet another aspect, the measurements described herein can be used to provide active feedback to a process tool (e.g., lithography tool, etch tool, deposition tool, etc.). For example, values of EPE or overlay error determined using the methods described herein can be communicated to a lithography tool to adjust the lithography system to achieve a desired output. In some example, corrections to process parameters determined based on measured EPE or overlay values may be communicated to a lithography tool, etch tool, or deposition tool. For example, etch parameters (e.g., etch time, diffusivity, etc.) or deposition parameters (e.g., time, concentration, etc.) may be included to provide active feedback to etch tools or deposition tools, respectively.

In some examples, the differences between measured parameter values before and after one or more etch steps, or lithographic steps may be used as an input to the closed loop control of the etch process or lithographic process.

In general, the electron beam measurements allows for global (wafer), field (field average), or local (per site) results that can be used, for example, to set the target bias between two process monitoring steps (i.e., etch and lithography), provide per field correction, or provide high order correction (e.g., OVL or EPE control).

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology, and inspection applications. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
    a plurality of electron beam measurement columns, each spatially separated from an adjacent electron beam measurement column of the plurality of electron beam measurement columns by a fixed distance along a first direction, each electron beam measurement column including:
        an electron beam source configured to generate a beam of primary electrons;
        a beam deflector configured to adjust a location of incidence of the beam of primary electrons onto a specimen under measurement; and
        a detector configured to detect secondary electrons from the specimen in response to the incident beam of primary electrons and generate an output signal based on the detected secondary electrons;
    a specimen positioning subsystem configured to scan a specimen in a second direction aligned with a row of die disposed on the specimen, wherein the first direction is oriented at an oblique angle with respect to the second direction such that each of the plurality of electron beam columns performs a one dimensional measurement of the same row of features of a different row of die; and
    a computing system configured to:
        receive the output signals generated by each of the electron beam measurement columns; and
        estimate an overlay value, an edge placement error value, or both, based on the output signals.

2. The metrology system of claim 1, wherein the first direction is oriented at the oblique angle with respect to the second direction by rotating the specimen with a rotary stage of the specimen positioning subsystem.

3. The metrology system of claim 1, further comprising:
a pre-alignment stage that orients the specimen such that the first direction is oriented at the oblique angle with respect to the second direction before loading the specimen onto the specimen positioning subsystem.

4. The metrology system of claim 1, wherein the first direction is oriented at the oblique angle with respect to the second direction by rotating the plurality of electron beam measurement columns with respect to the specimen.

5. The metrology system of claim 1, wherein the beam deflector is configured to adjust a location of incidence of the beam of primary electrons onto the specimen under measurement in response to an indication of a positioning error of the specimen positioning subsystem.

6. The metrology system of claim 1, wherein the beam deflector is configured to adjust a location of incidence of the beam of primary electrons onto the specimen under measurement to correspond to the row of features under measurement.

7. The metrology system of claim 1, wherein a positioning repeatability of the specimen positioning subsystem with respect to the plurality of electron beam measurement columns is less than one nanometer.

8. The metrology system of claim 1, wherein the estimating of the overlay value, the edge placement error value, or both, is based on a comparison of the output signals with design reference data.

9. The metrology system of claim 1, wherein a measurement spot size of the beam of primary electrons incident onto the specimen is less than ten nanometers.

10. A metrology system comprising:
a plurality of electron beam measurement columns, each spatially separated from an adjacent electron beam measurement column by a fixed distance along a column alignment direction;
a specimen positioning subsystem configured to scan a specimen below the plurality of electron beam measurement columns in a wafer scan direction that is parallel to a row of die disposed on the specimen; and
a computing system configured to:
determine a desired orientation of the wafer with respect to the column alignment direction such that each of the plurality of electron beam measurement columns performs a one dimensional measurement of the same feature row of a different die row; and
communicate a command signal that causes the wafer to be reoriented to the desired orientation.

11. The metrology system of claim 10, wherein each of the plurality of electron beam measurement columns comprises:
an electron beam source configured to generate a beam of primary electrons;
a beam deflector configured to adjust a location of incidence of the beam of primary electrons onto a specimen under measurement; and
a detector configured to detect secondary electrons from the specimen in response to the incident beam of primary electrons and generate an output signal based on the detected secondary electrons.

12. The metrology system of claim 11, wherein the computing system is further configured to:
receive the output signals generated by each of the electron beam measurement columns; and
estimate an overlay value, an edge placement error value, or both, based on the output signals.

13. The metrology system of claim 11, wherein the specimen positioning subsystem receives the command signal and a rotary stage of the specimen positioning subsystem reorients the wafer to the desired orientation.

14. The metrology system of claim 11, wherein the beam deflector is configured to adjust a location of incidence of the beam of primary electrons onto the specimen under measurement in response to an indication of a positioning error of the specimen positioning subsystem.

15. The metrology system of claim 11, wherein the beam deflector is configured to adjust a location of incidence of the beam of primary electrons to correspond to the row of features under measurement.

16. A method comprising:
scanning a specimen below a plurality of electron beam measurement columns in a wafer scan direction that is parallel to a row of die disposed on the specimen, wherein each of the plurality of electron beam measurement columns is spatially separated from an adjacent electron beam measurement column by a fixed distance along a column alignment direction; and
orienting the wafer scan direction of the specimen with respect to the column alignment direction at an oblique angle such that each of the plurality of electron beam measurement columns performs a one dimensional measurement of the same feature row of a different die row.

17. The method of claim 16, further comprising:
generating a plurality of beams of primary electrons;
deflecting each of the plurality of beams to adjust a location of incidence of each beam of primary electrons onto the specimen;
detecting secondary electrons from the specimen in response to the incident beams of primary electrons;
generating a plurality of output signals based on the detected secondary electrons; and
estimating an overlay value, an edge placement error value, or both, based on a comparison of the output signals with design reference data.

18. The method of claim 16, wherein the reorienting of the wafer scan direction with respect to the column alignment direction involves rotating the specimen with a rotary stage of a specimen positioning subsystem.

19. The method of claim 16, further comprising:
deflecting each of the plurality of beams to adjust a location of incidence of each beam of primary electrons onto the specimen in response to an indication of a positioning error of a specimen positioning subsystem.

20. The method of claim 16, further comprising:
deflecting each of the plurality of beams to adjust a location of incidence of each beam of primary electrons onto the specimen to overlap a row of features under measurement.

* * * * *